United States Patent [19]

Tanaka et al.

[11] 4,300,104

[45] Nov. 10, 1981

[54] AUTOMATIC GAIN CONTROL CIRCUIT FOR A NOISE PULSE CANCELLER

[75] Inventors: Kouichi Tanaka, Tokyo; Kiyoshi Amazawa, Ohmiya, both of Japan

[73] Assignees: Nippon Electric Co.; Clarion Co., Ltd., both of Tokyo, Japan

[21] Appl. No.: 58,400

[22] Filed: Jul. 17, 1979

[30] Foreign Application Priority Data

Jul. 17, 1978 [JP] Japan ............................ 53-98782[U]

[51] Int. Cl.³ .............................................. H03G 3/32
[52] U.S. Cl. .................................... 330/280; 330/281; 330/284
[58] Field of Search ................. 330/51, 149, 145, 138, 330/141, 279, 280, 281, 284; 455/219, 222, 223, 242, 244, 249, 253, 312; 179/1 P

[56] References Cited

U.S. PATENT DOCUMENTS 3,750,032  7/1973  Andrews ......................... 455/222 X Primary Examiner—James B. Mullins
Attorney, Agent, or Firm—Sughrue, Mion, Zinn, Macpeak and Seas

[57] ABSTRACT

In an automatic gain control circuit specifically adapted to control the gain of an amplifier for operating a noise cancelling circuit, a detector is provided for detecting a detector input signal, such as detected noise pulses. The detector includes a differential amplifier comprising a transistor pair connected to a constant current source. According to the detector input signal level, the constant current is switched between the transistor pair. The normally off transistor of the pair is connected to a third transistor, through which a substantially invariant current flows to relatively slowly charge a capacitor in a time constant circuit when the input signal level exceeds a reference level given by the difference between a pair of bias voltages for the transistor pair. The voltage accumulated across the capacitor serves as an automatic gain control signal, which rapidly disappears when the input signal level decreases below the reference level. The automatic gain control circuit may additionally comprise a similar detector responsive to an amplifier input signal supplied to the gain-controlled amplifier for likewise charging the capacitor through the third transistor.

3 Claims, 6 Drawing Figures

U.S. Patent Nov. 10, 1981 Sheet 1 of 2 4,300,104
FIG 1 PRIOR ART
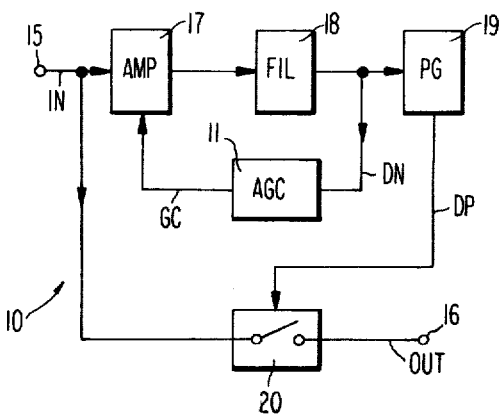
FIG 2 PRIOR ART
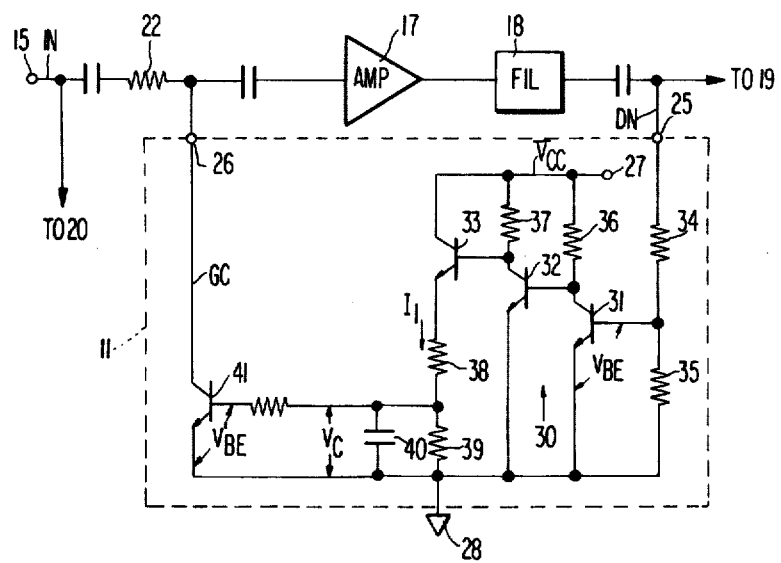
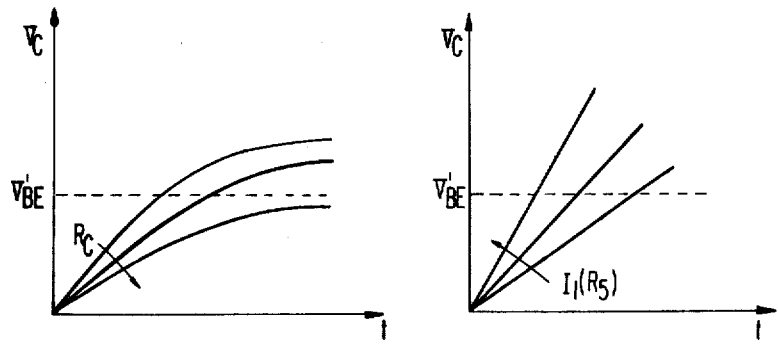
FIG 3 PRIOR ART      FIG 5

4,300,104

AUTOMATIC GAIN CONTROL CIRCUIT FOR A NOISE PULSE CANCELLER

BACKGROUND OF THE INVENTION

This invention relates to an automatic gain control circuit (which is abbreviated to an AGC circuit hereinafter) and, more particularly, to an AGC circuit for use in combination with a pulse noise cancelling system.

In a radio receiver for an automobile or the like, an input signal is unavoidably accompanied by pulse noises caused by a signal device on a road such as traffic signals and warning lights and an ignition device on an automobile in itself. Audible reproduction of these pulse noises is discomforting to listeners. A pulse noise cancelling system is therefore essential in the radio receiver of the above type.

In a conventional noise pulse cancelling system, the input signal is interrupted during production of the noise pulses to produce an intermittent output signal from which the noise pulses are removed. With this cancelling system however, no output signal is audibly reproduced for a long time in the presence of continuous or long-term noise. The lack of an output signal for such long periods is also disturbing to the listener. As will later be described with reference to two figures of the accompanying drawing, an AGC circuit is used together with the pulse noise cancelling system to remove the above-mentioned problems.

An AGC circuit of this kind is preferably rendered active as slowly as possible in view of the removal of the noise pulses. This is because the active AGC circuit allows the noise pulses to be reproduced to a certain degree. On the other hand, the AGC circuit should be rapidly switched to an inactive state since it will otherwise allow the noise pulses to be reproduced.

With a conventional AGC circuit, it is difficult to attain such requirements. Moreover, the conventional AGC circuit suffers from temperature dependency and inevitably causes click pulses to propagate through any other analog circuits.

It is empirically or experimentally known in the art that, under strong field intensities, listeners accept noises of comparatively high levels. Under weak field intensities, the AGC circuit is preferably rendered active irrespective of noise pulses. It is therefore desirable that the AGC circuit is rendered active when the noise pulses are continuous or high in level and the field intensity are very strong or very weak.

SUMMARY OF THE INVENTION

It is an object of this invention to provide an AGC circuit favorably applicable to a noise pulse cancelling system.

It is another object of this invention to provide an AGC circuit of the type described which is capable of being rendered active slowly and inactive rapidly.

It is a still another object of this invention to provide an AGC circuit of the type above which is substantially free from temperature dependency.

It is a further object of this invention to provide an AGC circuit of the foregoing type which does not give rise to click noises.

An automatic gain control circuit to which this invention is applicable is responsive to an input signal of a variable signal level for producing a gain control signal and is connected to an amplifier which is automatically gain controlled by the gain control signal. The control circuit has first and second terminals to be connected to an electric power source, an input terminal for said input signal, and an output terminal to be connected to the amplifier. The control circuit comprises (a) a first circuit means connected to the first, second and input terminals for comparing the input signal level with a preselected level to produce an energizing signal when the input signal level exceeds the preselected level, (b) a time constant circuit for accumulating the energizing signal to provide an accumulation level, and (c) output means connected to the time constant circuit and the output terminal for producing the gain control signal in accordance with the accumulation level.

According to this invention, the first circuit means comprises first bias means connected between the first and the second terminals for producing a first predetermined bias, second bias means connected between the first and second terminals for producing a second predetermined bias lower than the first predetermined bias to substantially define the predetermined level by a difference between the first and the second predetermined biases, first and a second transistors having first and second emitters connected to a point of connection, first and second collectors coupled to the first terminal, and first and second bases connected to the first and the bias means, respectively, a preselected one of the first and the second bases being connected to the input terminal, a constant current circuit connected between the point of connection and the second terminal, and a third transistor having a third emitter connected to the first terminal, a third collector connected to the time constant circuit, and a third base connected to a prescribed one of the first and the second collectors for supplying the time constant circuit with the energizing signal.

BRIEF DESCRIPTION OF THE DRAWING

FIG. 1 is a block diagram of a noise pulse cancelling system to which this invention is applicable;

FIG. 2 is a circuit diagram illustrating a conventional AGC circuit together with an amplifier and a filter shown in FIG. 1;

FIG. 3 is a time versus voltage characteristic of a time constant circuit used in FIG. 2;

FIG. 5 is a graphical representation of a characteristic of a time constant circuit used in FIG. 4.

DESCRIPTION OF THE PREFERRED EMBODIMENTS

Figure 4:
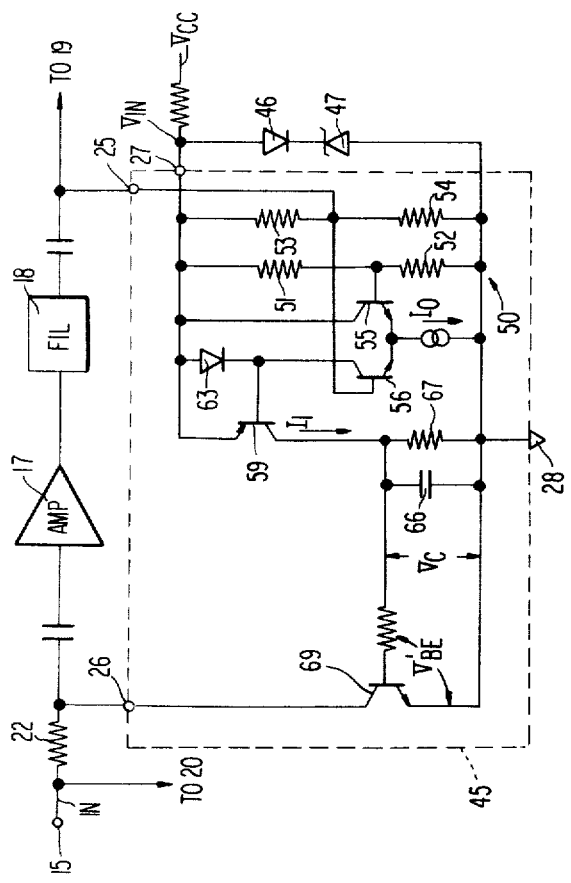
FIG. 4 is a circuit diagram of an AGC circuit according to a first embodiment of this invention.

Referring to FIGS. 1 and 2, description will be made of a noise pulse cancelling system 10 comprising a conventional AGC circuit 11 (described later with reference to FIG. 2) to facilitate an understanding of this invention. The system has a system input terminal 15 for a system input signal IN accompanied by one or more noise pulses and a system output terminal 16 for a system output signal OUT free from noise pulses. The system input signal IN falls within an audio frequency band between 50 Hz and 7.5 kHz in the example. The noise pulses have frequency components distributed in the audio frequency band and in a frequency band higher than the audio frequency band. The system 10 comprises an amplifier 17 for amplifying the system input signal IN partially delivered thereto, a high-pass filter 18 having a pass band between 15 kHz and 60 kHz for deriving from the noise pulses detected noise pulses DN, and a pulse generator 19 for supplying a gate circuit 20 with a detection pulse DP which is continuous during presence of the detected noise pulses DN or somewhat longer than the same. The gate circuit 20 interrupts the system input signal IN during presence of the detection pulse DP. Therefore, a long interruption of the output signal OUT results from continuous detected noise pulses DN, and is annoying to listeners.

In order to avoid this problem, the AGC circuit 11 is combined with the filter 18 and the amplifier 17. The AGC circuit 11 is responsive to the detected noise pulses DN for supplying the amplifier 17 with a gain control signal GC. Specifically, the AGC circuit 11 is rendered active to make the amplifier 17 reduce its gain in accordance with the gain control signal GC. As a result, the amplifier 17 produces a gain-controlled signal. The system input signal IN is not completely interrupted during operation of the AGC circuit 11.

Specifically referring to FIG. 2, the conventional AGC circuit 11 is coupled to the amplifier 17 and the filter 18 both of which are illustrated with reference to FIG. 1. The amplifier 17 is supplied with the system input signal IN through the system input terminal 15, a pair of capacitors (unnumbered), and an input resistor 22. The pulse generator 19 and the gate circuit 20 are omitted from this figure. The AGC circuit 11 has an input terminal 25 coupled to the filter 18 through a capacitor (unnumbered), an output terminal 26 coupled to the amplifier 17, and a first and a second terminal 27 and 28 to be connected to an electric power source (not shown) of a source voltage $V_{cc}$. The input terminal 25 is given the detected noise pulses DN as an input signal of a variable signal level. The AGC circuit 11 comprises a detection circuit 30 for detecting the signal level of the input signal to cause an electric current $I_I$ to flow as an output signal when the signal level exceeds a predetermined voltage. More particularly, the detection circuit 30 comprises three transistors 31, 32 and 33 of NPN type and four resistors 34, 35, 36, and 37. The series connection of two resistors 34 and 35 serve as a voltage divider to impart the input signal to the base of the transistor 31. Inasmuch as a base-emitter voltage $V_{BE}$ of the transistor 31 defines the predetermined voltage in the detection circuit 30, the transistors 31 and 33 are rendered conductive or saturated with the remaining transistor 32 cut off when the input signal divided by the voltage divider exceeds the base-emitter voltage $V_{BE}$. As a result, the transistor 33 gives rise to the current $I_I$. The current $I_I$ is supplied to a time constant circuit comprising a resistor 38 of resistance $R_c$, a resistor 39 of resistance $R_d$, and a capacitor 40 of capacity $C_1$. The capacitor 40 is charged through the resistor 38 to develop a voltage $V_c$ thereacross. Coupled to the capacitor 40, an output transistor 41 is controlled by the voltage $V_c$ across the capacitor 40. The gain control signal GC is supplied through the output terminal 26 to the amplifier 17 to decrease the gain of the amplifier 17. The voltage $V_{BE}$ of the first transistor 31 fluctuates with variation of temperature. Moreover, a d.c. current from the electric power source is rapidly changed each time when the transistors 31–33 are switched by the input signal. Therefore, the AGC circuit 11 has defects described in the Background of the Invention.

In addition, the AGC circuit 11 for the noise pulse cancelling system 10 is preferably rendered active as slowly as possible and inactive as fast as possible, as also pointed out in the Background. For this purpose, the resistance $R_c$ of the resistor 38 is desirably higher than the resistance $R_d$ of the resistor 39.

Temporarily referring to FIG. 3, wherein the abscissa and the ordinate represent time t and a voltage $V_c$ developed across the capacitor 40, respectively, it is readily understood that the voltage $V_c$ becomes gentle in its slope as the resistance $R_c$ increases, as depicted by an arrow. To increase of the resistance $R_c$ would make it difficult to render the voltage $V_c$ higher than a base-emitter voltage $V_{BE}'$ at which the output transistor 41 is rendered conductive, and the amplifier 17 would not be controlled by the gain control signal GC. Therefore, it is difficult to raise the resistance $R_c$ of the resistor 38 in the conventional AGC circuit 11.

Referring now to FIG. 4, an AGC circuit 45 according to a first embodiment of this invention is for use in combination with the amplifier 17 and the filter 18 depicted in FIG. 2. As is the case with FIG. 2, the AGC circuit 45 has the input and the output terminals 25 and 26 together with the first and the second terminals 27 and 28. In this example illustrated with reference to FIG. 4, a series connection of a diode 46 and a Zener diode 47 is attached to the AGC circuit 45 to stabilize the source voltage $V_{cc}$. As a result, a stabilized voltage $V_{IN}$ is supplied between the first and the second terminals 27 and 28. It is mentioned here that the diode 46 has a temperature characteristic substantially inverse relative to that of the Zener diode 47. Therefore, the stabilized voltage $V_{IN}$ does not suffer from temperature dependency in this example. The AGC circuit 45 comprises a detection circuit 50 for producing a current $I_I$ in response to the detected noise pulses DN. The detected noise pulses DN are supplied to the AGC circuit 45 as an input signal of a variable signal level. The detection circuit 50 comprises, as bias circuits, a first series connection of first and second resistors 51 and 52 connected to a first point of connection and a second series connection of third and fourth resistors 53 and 54 connected to a second point of connection. The first and the second series connections are connected between the first and the second terminals 27 and 28. Herein, let the first through fourth resistors 51 through 54 be of $R_1$, $R_2$, $R_3$, and $R_4$, respectively. The detection circuit 50 further comprises a first and a second transistor 55 and 56 of NPN type having a first and a second emitter connected to a third point of connection and a first and a second base connected to the first and the second points of connection, respectively. The first and the second transistors 55 and 56 further have a first and a second collectors coupled to the first terminal 27, respectively. A constant current circuit 58 known in the art is connected between the third point of connection and the second terminal 28 to produce a constant current $I_O$. The second base of the second transistor 56 is connected to the input terminal 25. The detection circuit 50 further comprises a third transistor 59 of PNP type having a third emitter connected to the first terminal 27, a third base connected to the second collector of the second transistor 56, and a third collector connected to a time constant circuit (described below). In addition, a diode 63 is connected between the third emitter and the third base of the third transistor 59. Under the circumstances, the first base of the first transistor 55 is supplied with a first bias voltage defined by the resistances $R_1$ and $R_2$ while the second base of the second transistor 56, a second bias voltage which is defined by the resistances $R_3$ and $R_4$ and is lower than the first bias voltage in this example. A difference between the first and the second bias voltages decides a gain control level $V_{AG}$ which corresponds to the base-emitter voltage $V_{BE}$ of the transistor 31 illustrated with reference to FIG. 2. The gain control level $V_{AG}$ is given by:

$$V_{AG} = V_{IN}[R_2/(R_1+R_2) - R_4/(R_3+R_4)] \quad (1)$$

In Equation (1), the stabilized voltage $V_{IN}$ is substantially constant, as mentioned before. The resistors 51 through 54 are made of the same material and, therefore, have the same temperature dependency. Moreover, the resistances of the respective resistors 51 through 54 appear on the denominator and the numerator of Equation (1) both of which are equally varied with variation of temperature. Therefore, temperature dependency of the resistors 51 through 54 is cancelled relative to each other. This means that the term in brackets of Equation (1) is also substantially invariable. Thus, the gain control level $V_{AG}$ is scarcely affected by temperature.

Further referring to FIG. 4, the first and the second transistors 55 and 56 act as a differential switching circuit for switching the constant current $I_O$. More particularly, the first transistor 55 is kept conductive with the second transistor 56 cut off when the signal level does not exceed the gain control level $V_{AG}$. In this state, the constant current $I_O$ flows through the first transistor 55. When the signal level of the input signal exceeds the gain control level $V_{AG}$, the second transistor 56 is rendered conductive with the first transistor 55 cut off. As a result, the constant current $I_O$ is switched from the first transistor 55 to the second transistor 56. It is mentioned here that the constant current $I_O$ is supplied through the diode 63 to the second transistor 56.

Inasmuch as the constant current $I_O$ is invariable even when one of the first and the second transistors 55 and 56 is switched to the other, no variation of the source voltage $V_{cc}$ takes place due to the switching operation of the differential switching circuit. The switching operation, therefore, gives rise to no click noises in any other circuits. In addition, the constant current $I_O$ flows through the diode 63 while the second transistor 56 is conductive. From this fact, it is readily understood that the current $I_I$ supplied from the third collector of the third transistor 59 is substantially invariable even when a voltage at the third collector varies from some reason. This is because the base-emitter voltage of the third transistor 59 is kept constant by the constant current $I_O$. Consequently, the third transistor 59 produces, as an energizing signal, the current $I_I$ each time when the signal level resulting from the detected noise pulses DN exceeds the gain control level $V_{AG}$.

Referring to FIG. 4 again, the time constant circuit connected to the third collector of the third transistor 59 comprises a parallel connection of a capacitor 66 of capacity $C_A$ and a fifth resistor 67 of resistance $R_5$. The capacitor 66 is charged by the current $I_I$ to develop a voltage $V_c$ thereacross. This accounts for the fact that the time constant circuit accumulates the energizing signal to produce an accumulated level. The accumulated level or voltage $V_c$ is supplied to a fourth transistor 69. The impedance or resistance of transistor 69 (between its collector and emitter) changes in accordance with variation of the voltage $V_c$. The gain control signal GC therefore appears as a variable collector voltage at the collector of the fourth transistor 69. As a result, an input level of the amplifier 17 is varied in cooperation with the resistance of the transistor 69 and the input resistor 22.

Taking the time constant circuit into consideration, the current $I_1$ is rendered zero when the signal level resulting from the detected noise pulses DN is lower than the gain control level $V_{AG}$. At this time, electric charges accumulated on the capacitor 66 are discharged through the fifth resistor 67. Therefore, the time constant circuit has a time constant for discharge $T_1$ determined by a product of the capacity $C_A$ and the resistance $R_5$. On the other hand, a time constant for charge $T_2$ may be decided independently of the time constant for discharge $T_1$ in this AGC circuit 45. In addition, the voltage $V_c$ tends to be sharply varied with increase of the resistance $R_5$ or the current $I_1$, as depicted by an arrow.

Referring to FIG. 5, wherein the abscissa and the ordinate represent time t and the voltage $V_c$ across the capacitor $C_A$, the voltage $V_c$ linearly increases over a base-emitter voltage $V_{BE}'$ at which the fourth transistor 69 is rendered conductive. As is understood from FIG. 5, it is possible for the time constant circuit to have the time constant for charge $T_2$ longer than the time constant for discharge $T_1$. This enables the AGC circuit 45 to be rendered active slowly and inactive quickly.

Figure 6:
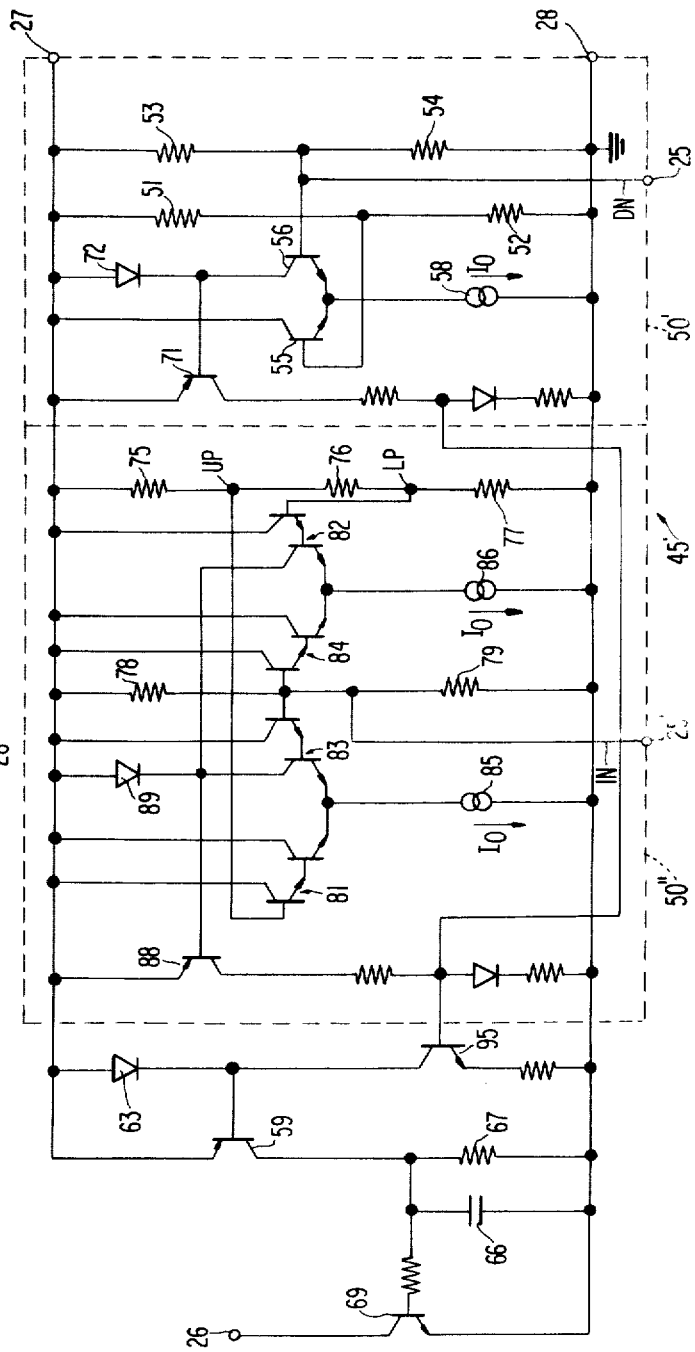
FIG. 6 is a circuit diagram of an AGC circuit according to a second embodiment of this invention.

Referring to FIG. 6, an AGC circuit 45' according to a second embodiment of this invention comprises, like FIG. 4, the third transistor 59, the time constant circuit comprising the capacitor 66 and the resistor 67, and the fourth transistor 69. The AGC circuit 45' further comprises a first detection circuit 50' similar to the detection circuit 50 illustrated with reference to FIG. 4. The first detection circuit 50' comprises similar parts depicted by like numerals, together with an output circuit coupled to the third transistor 59. The output circuit comprises a transistor 71 and a diode 72. Supplied with the detected noise pulses DN through the input terminal 25, the first detection circuit 50' is put into operation in the above-mentioned manner to energize the third transistor 59 through the output circuit. The AGC circuit 45' further comprises a second detection circuit 50'' for producing the gain control signal GC in response to the system input signal IN illustrated in FIG. 4 when the system input signal IN has a signal level higher than a third bias voltage and lower than a fourth bias voltage. For this purpose, the second detection circuit 50'' has an input terminal 25' to be connected to the system input terminal 15 shown in FIG. 4. The second detection circuit 50'' is coupled, together with the first detection circuit 50', to the third transistor 59 through an intermediate circuit comprising a transistor 95. The second detection circuit 50'' comprises a third series connection of resistors 75, 76, and 77 between the first and the second terminals 27 and 28 to impart the third and fourth bias voltages through an upper point UP and a lower point LP of connection, respectively. A fourth series connection of resistors 78 and 79 is also connected to the first and the second terminals to provide an intermediate bias voltage between the third and the fourth bias voltages. Preferably, the intermediate bias voltage is equal to the second bias voltage defined by the second series connection of the resistors 53 and 54. The third bias voltage is supplied to a first pair of transistors 81 and the fourth bias voltage to a second pair of transistors 82. The intermediate bias voltage is fed to a third pair 83 and a fourth pair 84 of transistors. Each pair of transistors is of a Darlington connection. The first and the third pairs are connected to a constant current circuit 85 while the second and the fourth pairs are connected to another constant current circuit 86. The second and the third pairs 82 and 83 are coupled through a transistor 88 and a diode 89 to the intermediate circuit. The intermediate circuit is for coupling the first and the second detection circuits 50' and 50" to the third transistor 59.

The system input signal IN of the variable signal level is supplied through the input terminal 25' to the third and the fourth pairs 83 and 84. When the signal level of the system input signal IN exceeds the third bias voltage applied to the first pair 81, the third pair 83 is rendered conductive to cause the constant current $I_0$ to flow therethrough. On the other hand, the second pair 82 becomes conductive when the signal level of the system input signal IN exceeds the fourth bias voltage. In any event, the third transistor 59 is eventually rendered conductive to produce the gain control signal GC. As is readily understood from the above, the second detection circuit 50" produces no output signal when the signal level of the system input signal IN falls within the third and the fourth bias voltages. In this case, the third transistor 59 may be rendered conductive in response to the output signal of the first detection circuit 50'.

While this invention has thus far been described in conjunction with a few preferred embodiments thereof, it is readily possible for those skilled in the art to put the invention into practice in various manners. For example, the third transistor 59 may be connected to one of the first and the second transistors 55 and 56 which is cut off during absence of the noise pulses. Further, the first and the second transistors 55 and 56 may be of PNP type while the third one may be of NPN type.

What is claimed is:

1. In an automatic gain control circuit responsive to an input signal having a variable signal level for producing a gain control signal, said gain control circuit connected to an amplifier which is automatically gain controlled by said gain control signal, said gain control circuit having first and second terminals connected to an electric power source, an input terminal receiving said input signal, and an output terminal connected to said amplifier, said control circuit comprising first circuit means connected to said first and second terminals and said input terminal for comparing said input signal level with a preselected level to produce an energizing signal when said input signal level exceeds said preselected level, a time constant circuit for accumulating said energizing signal to provide an accumulation level, and output means connected to said time constant circuit and said output terminal for producing said gain control signal in accordance with said accumulation level, the improvement wherein said first circuit means comprises:

first bias means connected between said first and said second terminals for producing a first predetermined bias;

second bias means connected between said first and second terminals for producing a second predetermined bias lower than said first predetermined bias to substantially define said preselected level by a difference between said first and said second predetermined biases;

a first and a second transistor having a first and a second emitter connected to a point of connection, a first and a second collector coupled to said first terminal, and a first and a second base connected to said first and said second bias means, respectively, a preselected one of said first and said second bases being connected to said input terminal;

a constant current circuit connected between said point of connection and said second terminal;

a third transistor having a third emitter connected to said first terminal, a third collector, and a third base connected to a prescribed one of said first and said second collectors for providing said energizing signal through said third collector, said energizing signal having a predetermined level, and said time constant circuit comprising a resistor connected between said third collector and said second terminal and a capacitor connected across said resistor, said capacitor being discharged with a first time constant substantially determined by said capacitor and said resistor and charged with a second time constant which is different from said first time constant and which is determined by said energizing signal level.

2. An automatic gain control circuit as claimed in claim 1, said control circuit for use in a system responsive to a system input signal accompanied by noise pulses which include frequency components higher than said system input signal, said control circuit for deriving said noise pulses to produce derived noise pulses to interrupt said system input signal in response to said derived noise pulses, and to produce a system output signal free from said noise pulses, said amplifier responsive to said system input signal and said gain control signal for producing a gain-controlled system signal, said system further comprising a filter for producing said derived noise pulses in response to said gain-controlled system signal, said first circuit means being supplied with said derived noise pulses as said input signal through said input terminal, wherein said control circuit further comprises: second circuit means responsive to said system input signal and responsive to a third predetermined bias higher than said first predetermined bias, a fourth predetermined bias lower than said second predetermined bias, and a fifth predetermined bias intermediate said third and said fourth predetermined bias, and coupled to said time constant circuit for producing said gain control signal when said system input signal exceeds said third and said fourth predetermined biases.

3. An automatic gain control circuit as claimed in claims 1 or 2, wherein said first bias means comprises a first series connection of first and second resistors connected to said first and said second terminals, respectively, said first predetermined bias appearing across said second resistor, said second bias means comprising a second series connection of third and fourth resistors connected to said first and said second terminals, respectively, said second predetermined bias appearing across said fourth resistor.

* * * * *